United States Patent
Inaba et al.

(10) Patent No.: US 8,924,000 B2
(45) Date of Patent: Dec. 30, 2014

(54) PARTS MOUNTING RELATED WORK DEVICE

(75) Inventors: Yuzuru Inaba, Yamanashi (JP); Osamu Okuda, Mie (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 939 days.

(21) Appl. No.: 13/000,755

(22) PCT Filed: May 28, 2009

(86) PCT No.: PCT/JP2009/002375
§ 371 (c)(1),
(2), (4) Date: Dec. 22, 2010

(87) PCT Pub. No.: WO2010/001527
PCT Pub. Date: Jan. 7, 2010

(65) Prior Publication Data
US 2011/0098840 A1    Apr. 28, 2011

(30) Foreign Application Priority Data
Jul. 1, 2008   (JP) ................................ 2008-172039

(51) Int. Cl.
*G06F 19/00*   (2011.01)
*H05K 13/04*   (2006.01)

(52) U.S. Cl.
CPC ........ *H05K 13/0452* (2013.01); *H05K 13/0404* (2013.01); *H05K 13/046* (2013.01); *H05K 13/0408* (2013.01); *G05B 2219/45029* (2013.01)
USPC .......................................... 700/114; 700/116

(58) Field of Classification Search
CPC ............. H05K 13/04; H05K 13/0404; H05K 13/0408; H01L 21/67144; G05B 2219/45029
USPC ................. 700/108, 109, 113, 114, 116, 121; 29/740
See application file for complete search history.

(56) References Cited

U.S. PATENT DOCUMENTS 6,059,121 A *  5/2000  Hirose .......................... 209/559
6,409,642 B2   6/2002  Tominaga et al.
(Continued)

FOREIGN PATENT DOCUMENTS

CN    1714611 A     12/2005
JP    11-340695 A   12/1999
(Continued)

OTHER PUBLICATIONS

International Search Report for Appl. No. PCT/JP2009/002375 dated Jun. 23, 2009.
(Continued)

*Primary Examiner* — Mohammad Ali
*Assistant Examiner* — Nathan Laughlin
(74) *Attorney, Agent, or Firm* — Pearne & Gordon LLP

(57) ABSTRACT

A problem that the present invention is to solve is to provide a parts mounting related work device which can prevent the occurrence of an unexpected operation failure and an erroneous stopping of the whole system which are attributed to an error in combination of working head and working equipment.
A storage part (24c) stores combinations of types of working heads (H) and types of working equipment (E) which correspond to contents of work that is performed on a board (PB), and a determination part (24d) determines whether or not the combination of the type of the working head (H) which is currently detected by a head type detector and the type of the working equipment which is currently detected by an equipment type detector coincides with any of combinations stored in the storage part (24c). An action restriction part (24e) restricts a moving action of a moving stage (11) by an action control part (24a) in case the determination part (24d) determines that the combination of the type of the working head (H) which is currently attached to the moving stage (11) and the type of the working equipment which is currently mounted in a base platform (3) coincides with non of the combinations stored in the storage part (24c).

2 Claims, 12 Drawing Sheets

(56) References Cited

U.S. PATENT DOCUMENTS

| | | |
|---|---|---|
| 6,968,610 B2 | 11/2005 | Nagao et al. |
| 2001/0002380 A1 | 5/2001 | Tominaga et al. |
| 2003/0135991 A1 | 7/2003 | Nagao et al. |
| 2006/0085973 A1 | 4/2006 | Kodama et al. |
| 2011/0225811 A1 | 9/2011 | Kodama et al. |

FOREIGN PATENT DOCUMENTS

| | | | |
|---|---|---|---|
| JP | 2004-6512 A | 1/2004 | |
| JP | 2004-221518 A | 8/2004 | |
| JP | 2004-281717 A | 10/2004 | |
| JP | 3960054 B2 | 5/2007 | |
| JP | 2008-108919 A | 5/2008 | |

OTHER PUBLICATIONS

Chinese Office Action for application No. 200980125120.1 dated Apr. 3, 2013.

* cited by examiner

FIG. 12

| | WORKING HEAD | WORKING EQUIPMENT | |
|---|---|---|---|
| | | BASE PLATFORM LOWER PORTION | BASE PORTION |
| PARTS MOUNTING WORK | MOUNTING HEAD | TROLLEY | NOZZLE CHANGER |
| APPLICATION WORK | APPLICATION HEAD | SAFTY COVER | TRIAL APPLICATION UNIT |
| INSPECTION WORK | INSPECTION HEAD | SAFTY COVER AND INSPECTION UNIT | CALIBRATOR |

PARTS MOUNTING RELATED WORK DEVICE

TECHNICAL FIELD

The present invention relates to a parts mounting related work device in which a working head attached to a moving stage and working equipment mounted on a base platform are free to be replaced, so that a plurality of types of work can be done on a board.

BACKGROUND ART

As parts mounting related work devices, there are known, for example, an application device for applying an adhesive to a board and an inspection device for inspecting a surface of a board. Although these parts mounting related work devices are generally fabricated as separate devices, among parts mounting devices, there is a parts mounting device which is designed to perform by itself mounting work of a variety of types of parts by enabling various types of mounting heads (different types of mounting heads) to be replaced (Patent Document 1).

RELATED ART DOCUMENT

Patent Document

Patent Document 1: Japanese Patent No. 3960054

SUMMARY OF THE INVENTION

Problem that the Invention is to Solve

Here, it is considered that a plurality of types of work can be done on a board by a single parts mounting related work device (hereinafter, referred to simply as a working device) by enabling working heads that are to be attached to a moving stage and necessary working equipment to be replaced freely to match work to be done on the board. In this case, when this working device is used as a parts mounting device, a mounting head is used as a working head, and a parts supply unit and a nozzle changer (a unit for changing nozzles that are to be attached to the mounting head) are used as working equipment that is mounted on a base platform. When the working device is used an application device, an application head is used as the working head, and a trial application unit for effecting a trial application of an adhesive or the like is used as the working equipment. When the working device is used as an inspection device, an inspection head including an inspection camera is used as the working head, and an inspection unit such as a personal computer is used as the working equipment.

In a parts mounting related work device like this, however, in the event that work is performed with an incorrect combination of working head and working equipment, there will be caused a problem that an unexpected operation failure occurs, whereby there is caused a fear that the whole system is erroneously stopped.

Then, an object of the invention is to provide a parts mounting related work device which can prevent the occurrence of an unexpected operation failure and an erroneous stopping of a whole system which are attributed to an error in combination of working head and working equipment.

A parts mounting related work device described in Claim 1 comprises a base platform including a board positioning portion which positions a board, a moving stage provided movably relative to the board which is positioned by the board positioning portion, a working head detachably attached to the moving stage for change in accordance with contents of work to be done on the board, an action controller for performing a moving action control of the moving stage, working equipment removably mounted on the base platform for change in accordance with contents of work to be done on the board, a storage which stores combinations of types of working heads and types of working equipment which correspond to contents of work to be done on the board, a head type detector for detecting a type of a working head currently attached to the moving stage, an equipment type detector for detecting a type of working equipment currently mounted on the base platform, a determination unit for determining whether or not a combination of the type of the working head currently detected by the working head type detector and the type of the working equipment currently detected by the working equipment type detector coincides with any of the combinations stored in the storage, and an action restriction means for restricting a moving action of the moving stage in case the determination unit determines that the combination of the type of the working head currently detected by the working head type detector and the type of the working equipment currently detected by the working equipment type detector coincides with none of the combinations stored in the storage.

Advantage of the Invention

Although the parts mounting related work device of the invention can perform a plurality of types of work on a board by replacing working heads to be attached to the moving stage and replacing working equipment to be mounted on the base platform, in case the combination of the type of the working head currently detected by the head type detector (that is, currently attached to the moving stage) and the type of the working equipment currently detected by the working equipment type detector (that is, currently mounted on the base platform) coincides with none of the combinations stored in the storage, the moving action of the moving stage is designed to be restricted. Because of this, as a condition for operation of the parts mounting related work device, it is necessary that a correct combination of working head and working equipment is used thereon, and hence, since no work is performed thereby in such a state that a wrong combination of working head and working equipment is used, it is possible to prevent the occurrence of an unexpected operation failure and an erroneous stopping of the whole system which are attributed to an error in combination of working head and working equipment.

BRIEF DESCRIPTION OF THE DRAWINGS

FIG. 12 A diagram showing an example of data stored in a storage portion of the parts mounting related work device according to the embodiment of the invention.

MODE FOR CARRYING OUT THE INVENTION

Figure 1:
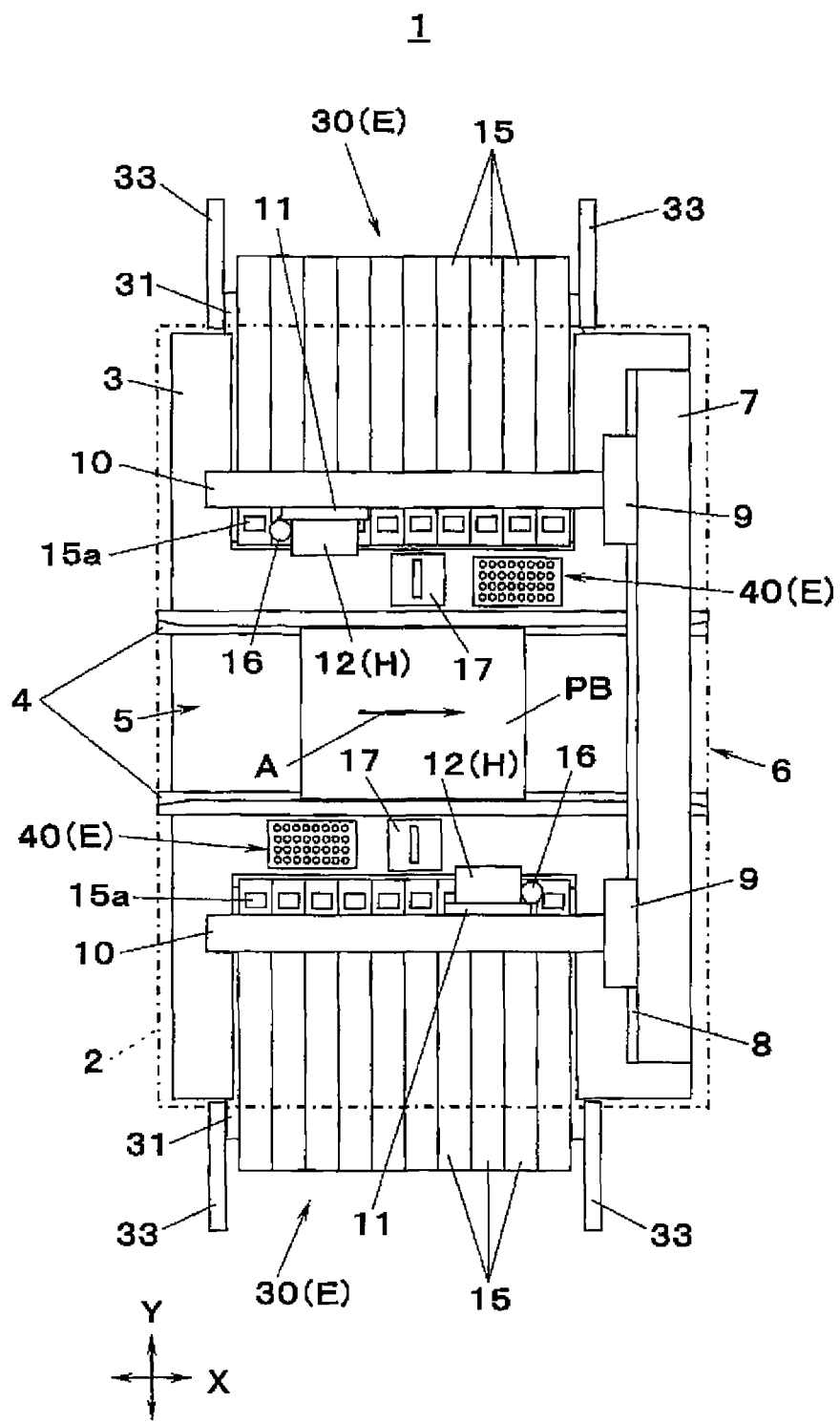
FIG. 1 A plan view of a parts mounting related work device according to an embodiment of the invention.
Figure 8:
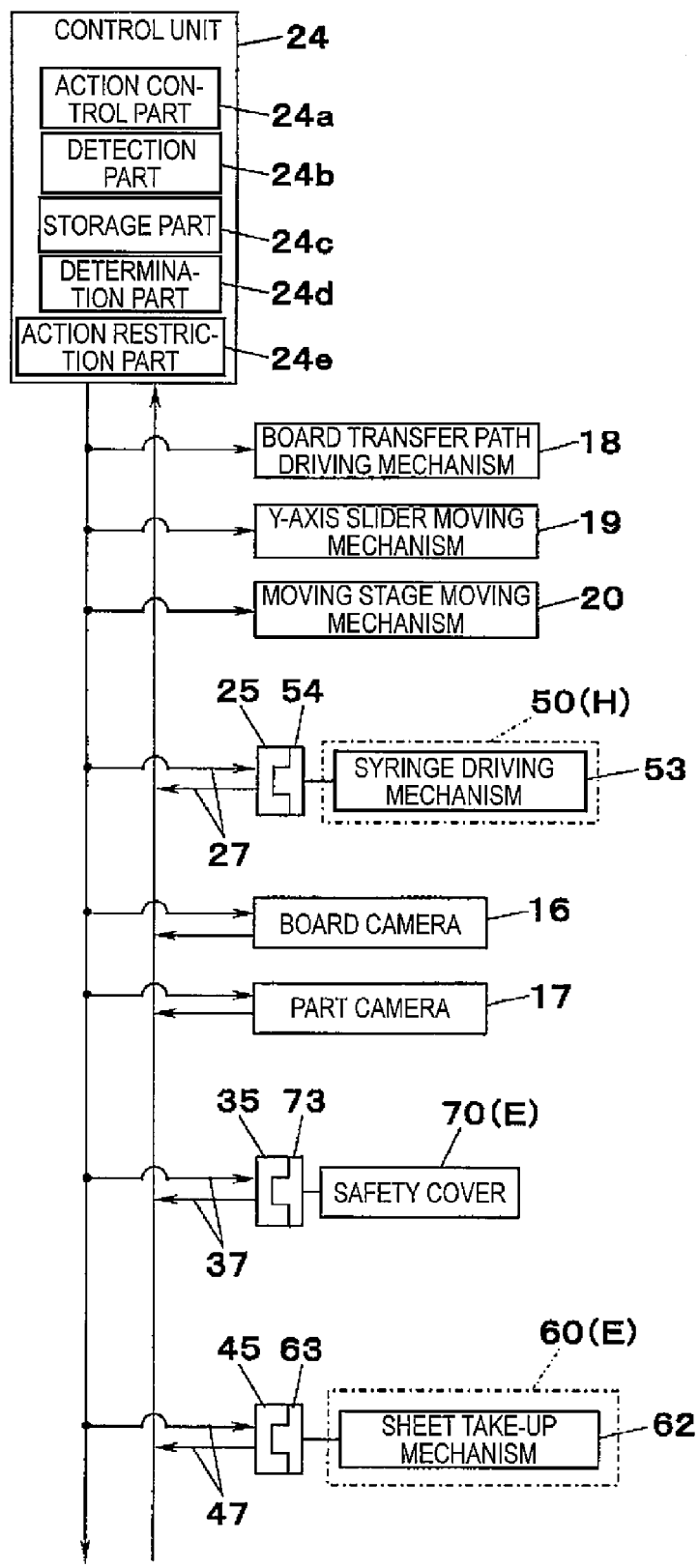
FIG. 8 A block diagram showing a control system of the parts mounting related work device according to the embodiment of the invention.
Figure 9:
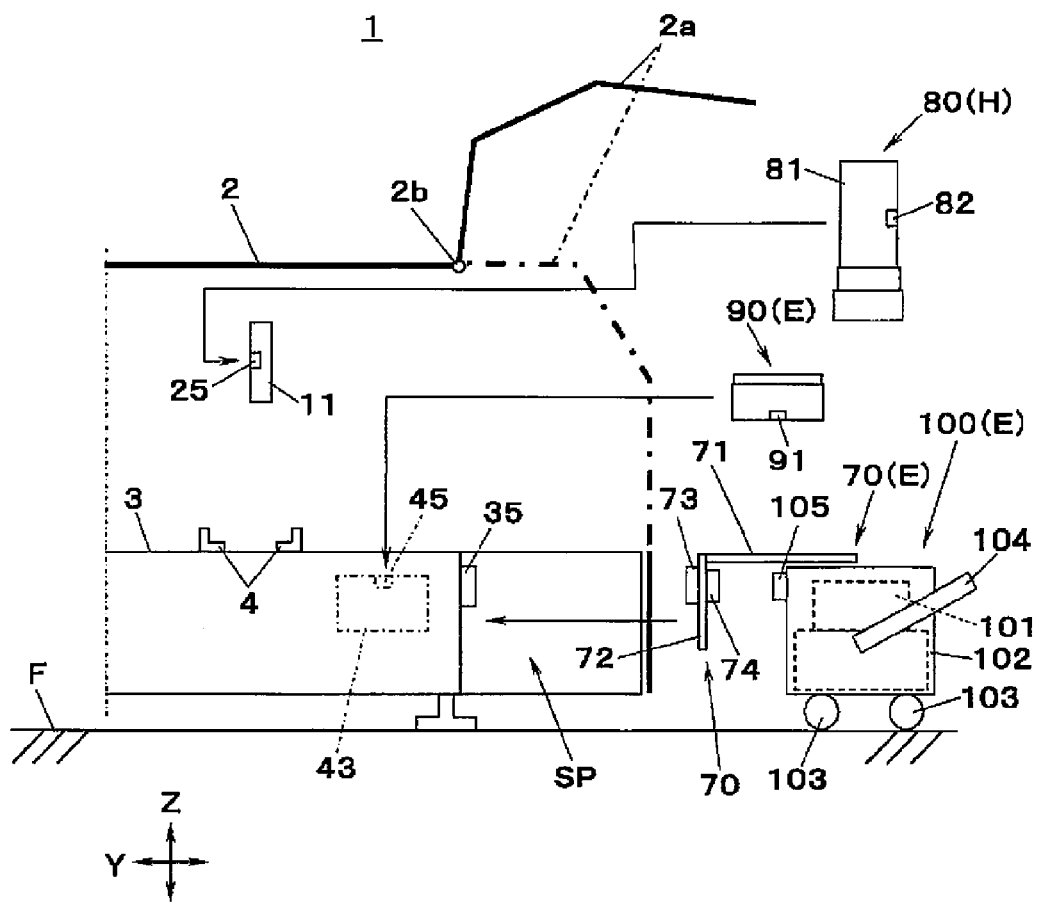
FIG. 9 A partial enlarged side view of the parts mounting related work device according to the embodiment of the invention.
Figure 10:
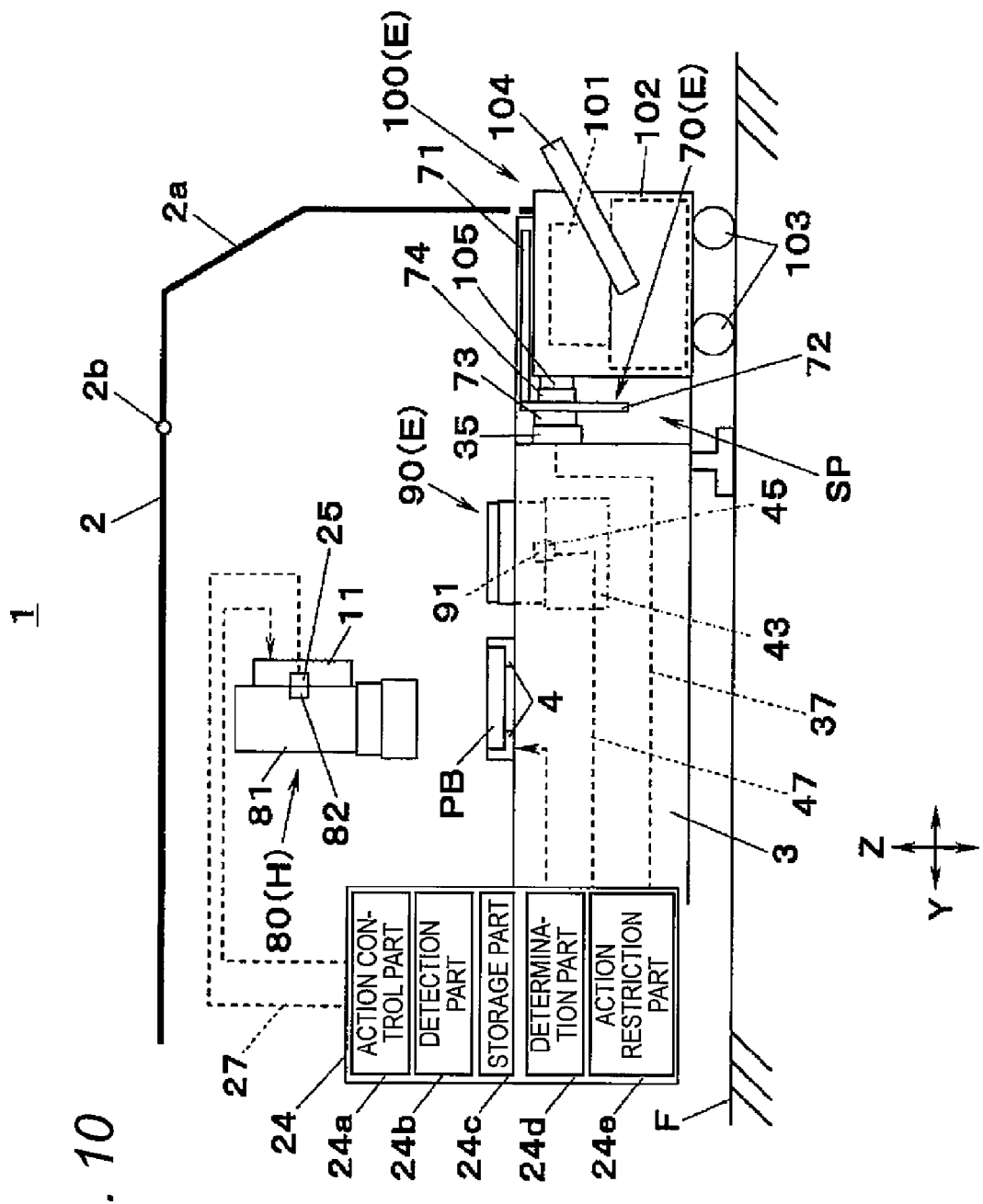
FIG. 10 A partial enlarged side view of the parts mounting related work device according to the embodiment of the invention.
Figure 11:
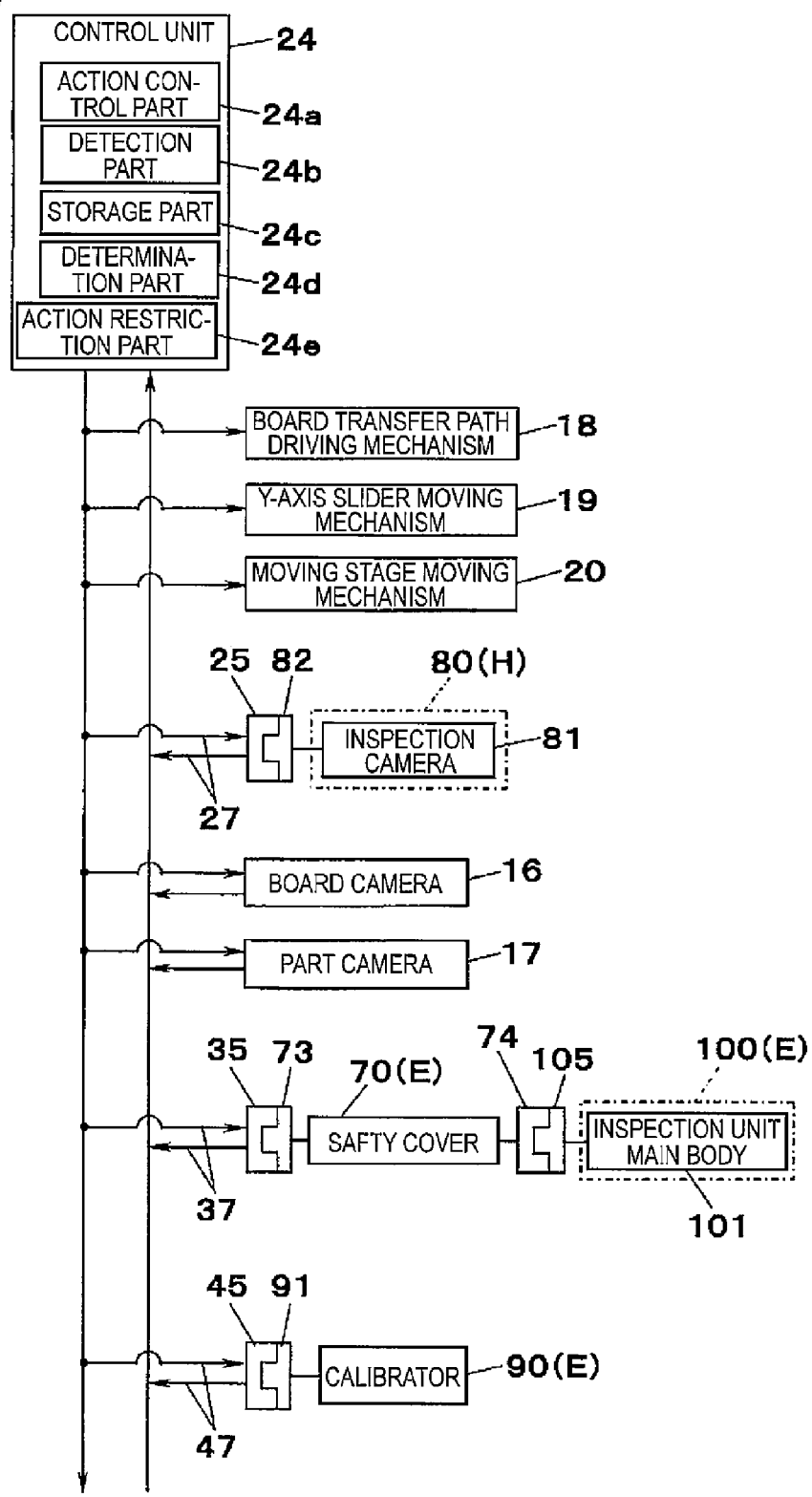
FIG. 11 A block diagram showing a control system of the parts mounting related work device according to the embodiment of the invention.

Hereinafter, an embodiment of the invention will be described by reference to the drawings. FIG. 1 is a plan view of a parts mounting related work device according to an embodiment of the invention, FIG. 2 is a side view of the parts mounting related work device according to the embodiment of the invention, FIG. 3 is a block diagram showing a control system of the parts mounting related work device according to the embodiment of the invention, FIGS. 4, 5, 6 and 7 are partial enlarged side views of the parts mounting related work device according to the embodiment of the invention, FIG. 8 is a block diagram showing a control system of the parts mounting related work device according to the embodiment of the invention, FIGS. 9 and 10 are partial enlarged side views of the parts mounting related work device according to the embodiment of the invention, FIG. 11 is a block diagram showing a control system of the parts mounting related work device according to the embodiment of the invention, and FIG. 12 is a diagram showing an example of data stored in a storage portion of the parts mounting related work device according to the embodiment of the invention.

Figure 2:
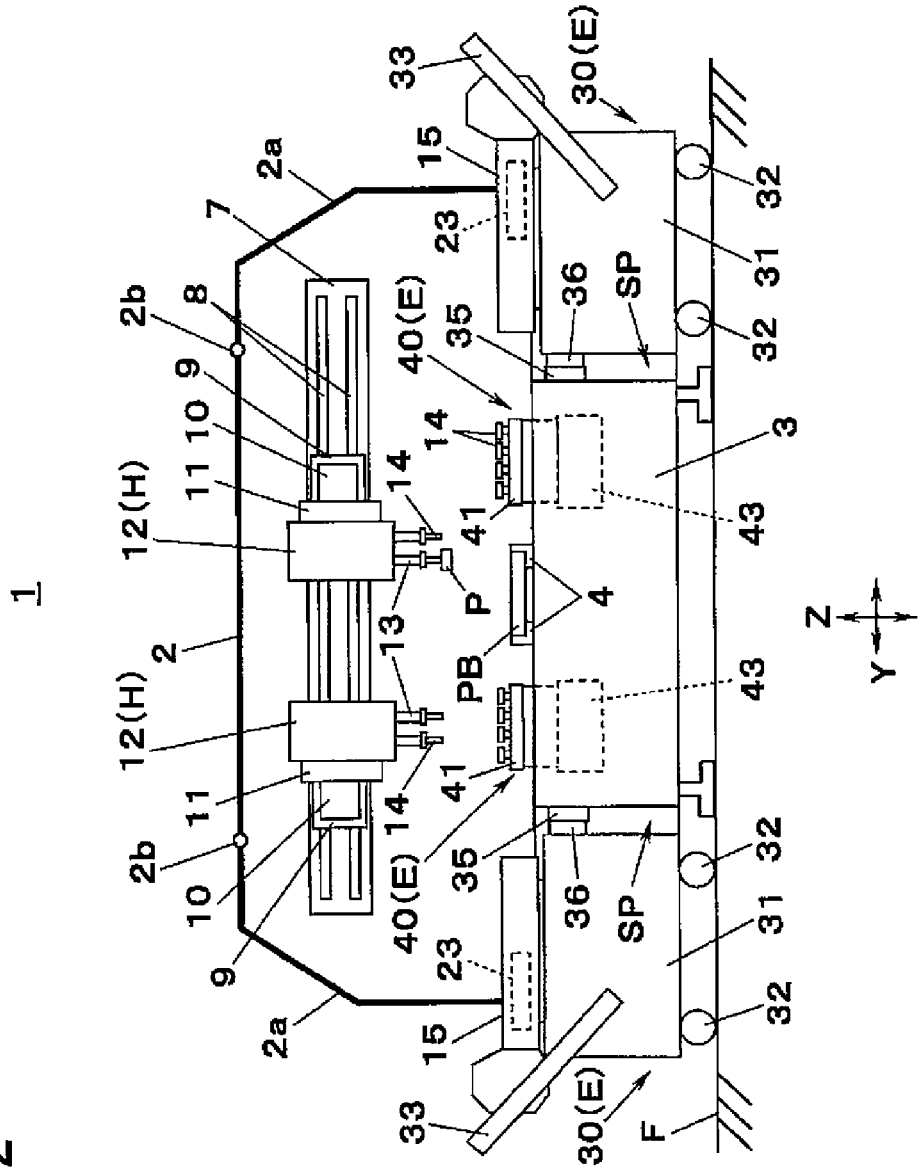
FIG. 2 A side view of the parts mounting related work device according to the embodiment of the invention.
Figure 3:
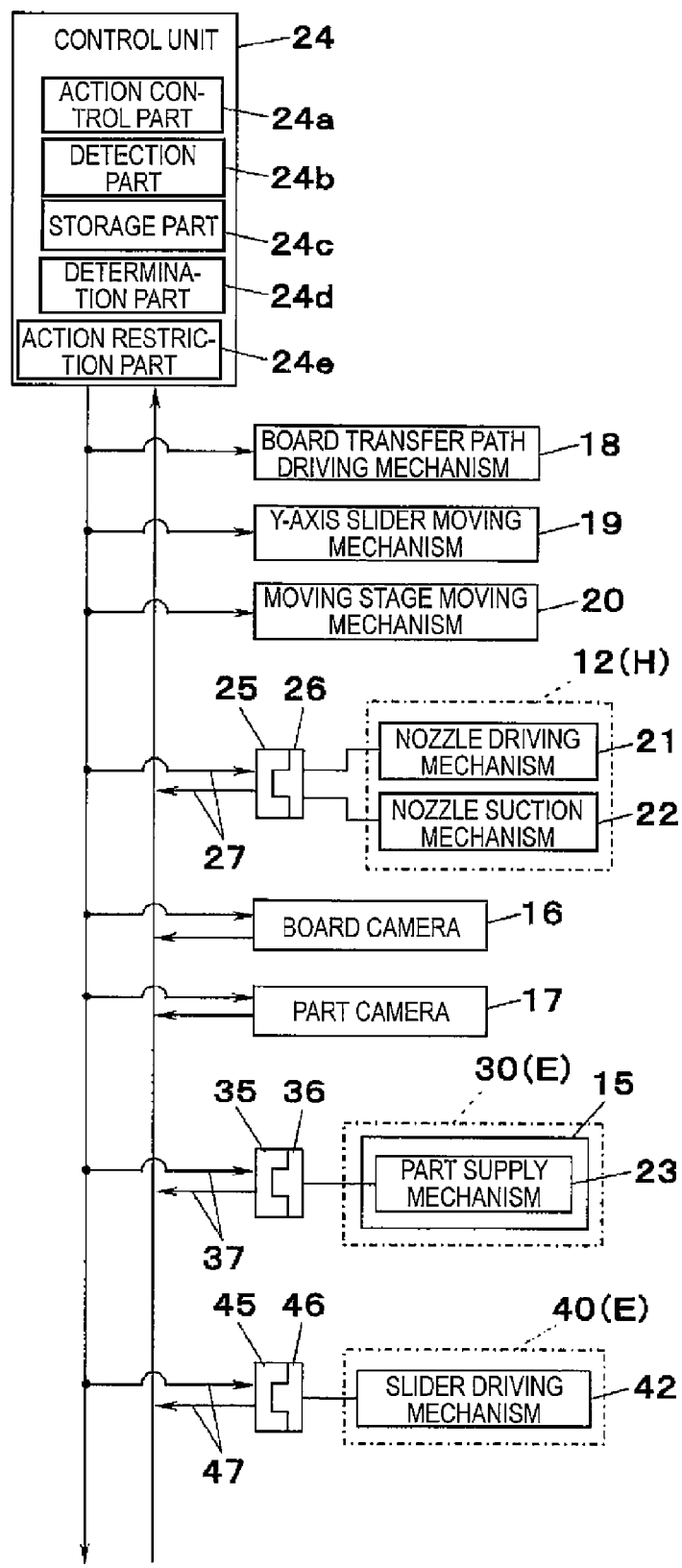
FIG. 3 A block diagram showing a control system of the parts mounting related work device according to the embodiment of the invention.

In FIGS. 1 and 2, a parts mounting related work device 1 has a base platform 3 which is covered by a base platform cover 2, and a board transfer path 4 (a board positioning portion) made up of a pair of belt conveyors, which are caused to travel synchronously in a horizontal direction (an X-axis direction), is provided on the base platform 3. The board transfer path 4 transfers a board PB supplied to a board entrance 5 in the X-axis direction (an arrow A shown in FIG. 1) and positions the board PB in a predetermined position.

A Y-axis table 7 is provided above the board transfer path 4 so as to extend in a direction which horizontally intersects the X-axis at right angles (a Y-axis direction). Two parallel slide guides 8 are provided on a lateral surface of the Y-axis table 7 so as to extend in the Y-axis direction, and two Y-axis sliders 9 are provided on the two slide guides 8 so as to move freely along the slide guides 8 (that is, in the Y-axis direction). One end portion of an X-axis table 10, which extends in the X-axis direction, is attached to each Y-axis slider 9, and a moving stage 11, which moves freely along the X-axis table 10 (that is, in the X-axis direction), is provided on each X-axis table 10.

As is shown in FIGS. 1, 2, 3 and 4, when this parts mounting related work device 1 is used as a parts mounting device, a mounting head 12 is attached to each moving stage 11 as a working head H. As is shown in FIG. 2, a plurality of hollow nozzle shafts 13 are provided on each mounting head 12 so as to extend downwards, and a suction nozzle 14 is detachably attached to a lower end portion of each nozzle shaft 13.

Pluralities of part supply units 15 for supplying parts P (FIG. 2) are provided in side areas in the Y-axis direction of the board transfer path 4 so as to be aligned in the X-axis direction. A board camera 16 whose image capturing plane is directed downwards is provided on each moving stage 11, and part cameras 17 whose image capturing plane is directed upwards is provided on the base platform 3.

In FIG. 3, provided on the base platform 3 are a board transfer path driving mechanism 18 for driving the board transfer path 4, a Y-axis slider moving mechanism 19 for moving the Y-axis sliders 9 along the Y-axis table 7 and a moving stage moving mechanism 20 for moving the moving stages along the X-axis table 10. Provided in each mounting head 12 are a nozzle driving mechanism 21 for lifting up and down and rotating the nozzle shafts 13 (that is, the suction nozzles 14) about a vertical axis (a Z-axis) and a nozzle attracting mechanism 22 for causing the suction nozzles 14 to perform an attracting action of a part P. A part supply mechanism 23 is incorporated in each part supply unit 15 (also refer to FIG. 2), and a part P is supplied to a part supply port 15a (FIG. 1) by driving this part supply mechanism 23.

In FIG. 3, the board transfer path driving mechanism 18, the Y-axis slider moving mechanism 19, the moving stage moving mechanism 20, the nozzle driving mechanism 21, the nozzle attracting mechanism 22, the board cameras 16 and the part cameras 17 are controlled with respect to operations thereof by an action control part 24a of a control unit 24 which is provided in the parts mounting related work device 1.

The action control part 24a of the control unit 24 controls the operation of the board transfer path driving mechanism 18 so as to effect a transfer and positioning of boards PB by the board transfer path 4 and moves the moving stages 11 in the horizontal direction by combining the movement of the Y-axis sliders 9 in the Y-axis direction by the Y-axis slider moving mechanism 19 and the movement of the moving stages 11 in the X-axis direction by the moving stage moving mechanism 20. Namely, the action control part 24a of the control unit 24 constitutes an action control means for controlling the moving actions of the moving stages 11.

The action control part 24a of the control unit 24 controls the operation of the nozzle driving mechanism 21 and the operations of the nozzle attracting mechanism 22 so as to effect a suction and rotation of parts P by the suction nozzles 14 and to effect a capture of an image of board marks (not shown) provided on the boards PB by the board cameras 16 and a capture of an image of the parts P which are attracted to the suction nozzles 14 by the part cameras 17. Image data of the board marks whose images are captured by the board cameras 16 and image data of the parts P whose images are captured by the part cameras 17 are sent to the control unit 24 (FIG. 3).

Figure 4:
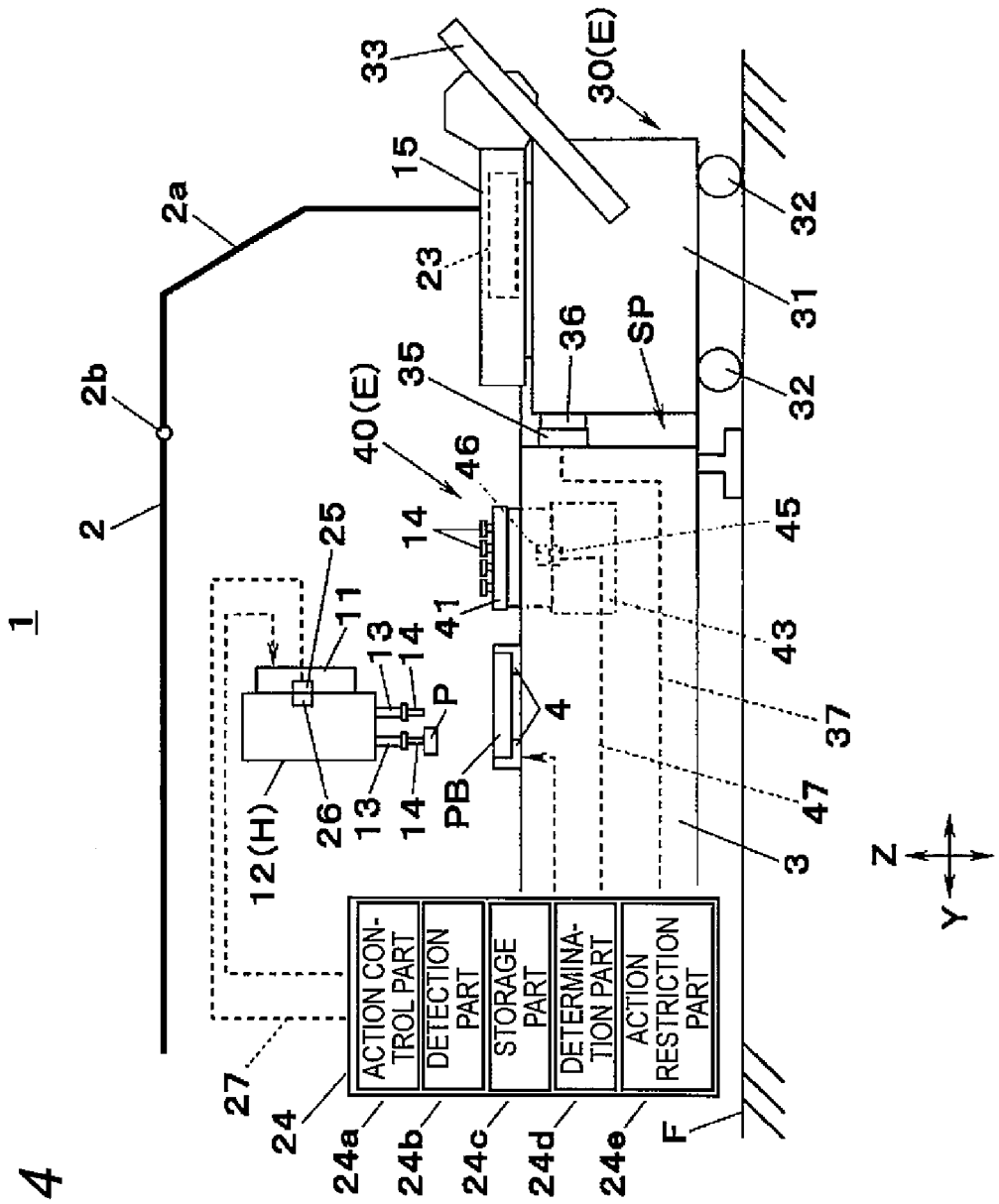
FIG. 4 A partial enlarged side view of the parts mounting related work device according to the embodiment of the invention.

In FIG. 4, the mounting head 12 is detachably attached to the moving stage 11. When the mounting head 12 is attached to the moving stage 11, a moving stage side connector 25 provided on the moving stage 11 and a mounting head side connector 26 provided on the mounting head 12 are coupled together (also refer to FIG. 3), and signal cables and power cables for activating the nozzle driving mechanism 21 and the nozzle suction mechanism 22 which are provided in the mounting head 12 and lines for supplying and discharging air to and from the suction nozzle 14 are connected together. The control unit 24 detects the coupling of the moving stage side connector 25 and the mounting head side connector 26 by a plug-and-play function via a first connector wiring 27 and grasps the state in which the mounting head 12 is attached to the moving stage 11.

In FIG. 4, each part supply unit 15 is held on an upper portion of a trolley 30 which can move on a floor F. The trolley 30 has a plurality of wheels 32 on a lower surface of a base portion 31, and a handle 33 which the operator operates to push or pull is provided on the base portion 30. The operator operates the handle 33 to push or pull so as to move the trolley 30 on the floor F to make the trolley 30 approach the base platform 3 and inserts the trolley 30 into a trolley insertion space SP formed in a lower portion of the base platform 3 for attachment to the base platform 3 based on a predetermined procedure. This attachment produces a state in which each part supply unit 15 is fixed relatively to the base platform 3.

In FIG. 4, a base platform side connector 35, which opens towards the trolley 30 inserted into the trolley insertion space SP, is provided in the base platform 3, and a trolley side connector 36, which opens towards the base platform side connector 35 in such a state that the trolley 30 is inserted in the trolley insertion space SP in the lower portion of the base platform 3, is provided in the trolley 30.

In FIG. 4, when the trolley 30 is inserted into the trolley insertion space SP in the lower portion of the base platform 3 and the trolley 30 is attached to the base platform 3, the base platform side connector 35 and the trolley side connector 36 are coupled (also refer to FIG. 3), and signal cables and power cables for activating the part supply mechanism 23 provided each part supply unit 15. The control unit 24 detects that the base platform side connector 35 and the trolley side connector 36 have been coupled together by the plug-and-play function via a second connector wiring 37 and grasps the state in which the trolley 30 is attached to the base platform 3 (that is, the trolley 30 is inserted in the trolley insertion space SP in the lower portion of the base platform 3).

Here, the base platform side connector 35 and the trolley side connector 36 may only have to be configured to be coupled together only in such a state that the trolley 30 is attached to the base plat form 3. Both the connectors 35, 36 may come to be coupled together by an action to attach the trolley 30 to the base platform 3, or one or both of the connectors 35, 36 may be connector to cords so that both the connectors 35, 36 come to be coupled together manually, separately from the attachment after the trolley 30 is attached to the base platform 3.

In FIGS. 1 and 4, replacement suction nozzles 14 held in an upright posture in areas between the board transfer path 4 and the part supply nits 15, and nozzle changers 40 are provided which change the attracting nozzles 14 on the nozzle shafts 13.

This nozzle changer 40 detaches the attracting nozzle 14 attached to the nozzle shaft 13 of the mounting head 12 and attaches a replacement attracting nozzle 14 to the nozzle shaft 13 by causing a movable slider 41 provided in an upper portion to slide in a horizontal direction by a slider driving mechanism 42 (FIG. 3) so as to be positioned in either a pick-up enabling position where the attracting nozzles 14 held in the upright posture can be picked up in an upward direction or a pick-up disabling position where the attracting nozzles 14 are not allowed to be so picked up.

In FIG. 4, the nozzle change 40(E) is detachably attached to an upper surface side of a base portion 43 which is incorporated in the base platform 3. When the nozzle changer 40 is attached to the base portion 43, a base portion side connector 45 provided in the base portion 43 and a nozzle changer side connector 46 provided in the nozzle changer 40 are coupled together (also refer to FIG. 3), whereby signal cables and power cables for activating the slider driving mechanism 42 are connected together. The control unit detects that the base portion side connector 45 and the nozzle changer side connector 46 have been coupled together by the plug-and-play function via a third connector wiring 47 and grasps the state in which the nozzle changer 40 is attached to the base portion 43.

In the parts mounting work by the parts mounting related work device 1, firstly, the action control part 24a of the control unit 24 activates the board transfer path 4 so that a board PB transferred from an upstream side unit (another unit disposed on an upstream side of the parts mounting related work device 1) is transferred into the parts mounting related work device 1 from the board entrance 5 and is then positioned in a predetermined working position. Then, the moving stage 11 is caused to move within a horizontal plane so as to be positioned above the board PB, and the board camera 16 is caused to take an image of a board mark so as to obtain a positional deviation of the board PB from a reference position thereof.

Having obtained the positional deviation of the board PB, the action control part 24a of the control unit 24 moves the moving stage 11 to a position lying above the part supply port 15a of the part supply unit 15, lowers the nozzle shaft 13, and causes the suction nozzle 14 to pick up (attract) a part P supplied to the part supply port 15a of the part supply unit 15.

Having caused to the suction nozzle 14 to pick up the part P, the action control part 24a of the control unit 24 moves the moving stage 11 so that the part P is positioned directly above the part camera 17 and causes the part camera 17 to take an image of the part P so as to obtain a positional deviation of the part P with respect to the suction nozzle 14.

Having obtained the positional deviation of the part P with respect to the suction nozzle 14, the action control part 24a of the control unit 24 moves the moving stage 11 to be positioned above the board PB, lowers the nozzle shaft 13 and mount the part P in a target mount position on the board PB. When mounting the part P on the board PB, the action control part 24a of the control unit 24 performs a correcting action of the relative position of the attracting nozzle 14 to the board PB so that the positional deviation of the board PB from the reference position which was determined when the board PB was positioned and the positional deviation of the part P with respect to the suction nozzle 14 which was obtained when the part P was identified are corrected.

Having performed the series of steps from the pick-up of the part P to the mounting of the part P on the board PB on all parts P to be mounted on the board PB, the action control part 24a of the control unit 24 drives the board transfer path 4 so as to discharge the board PB to the outside of the parts mounting related work device 1 from a board exit 6.

In the parts mounting related work device 1 according to the embodiment, other work than the parts mounting work can be done by replacing the working head H attached to the moving stage 11 by another working head H which performs work of different contents from those of the mounting head 12 on the board PB. For example, the parts mounting related work device 1 can be used as an application device by replacing the mounting head 12 attached to the moving head 11 by an application head 50 (FIGS. 5, 6, 7 and 8), thereby making it possible to perform application work of applying an adhesive or the like to the board PB.

Figure 5:
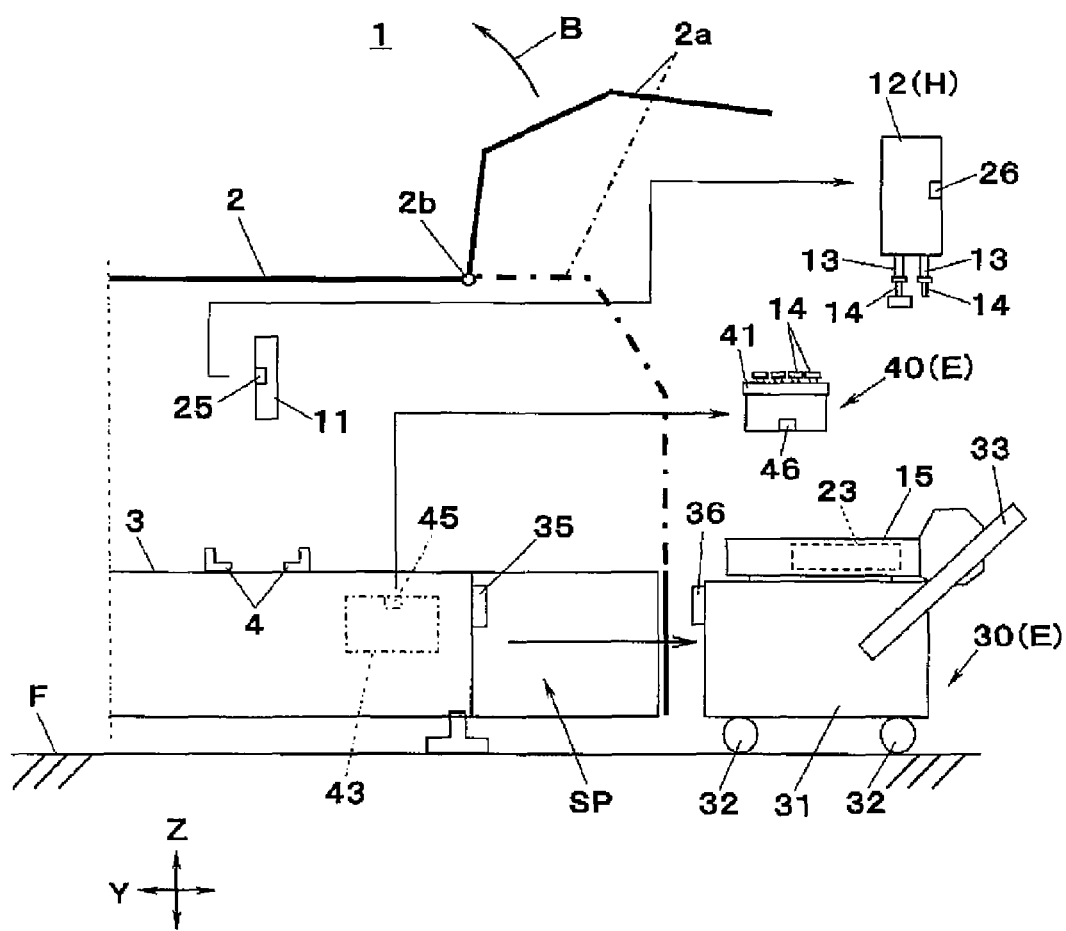
FIG. 5 A partial enlarged side view of the parts mounting related work device according to the embodiment of the invention.
Figure 6:
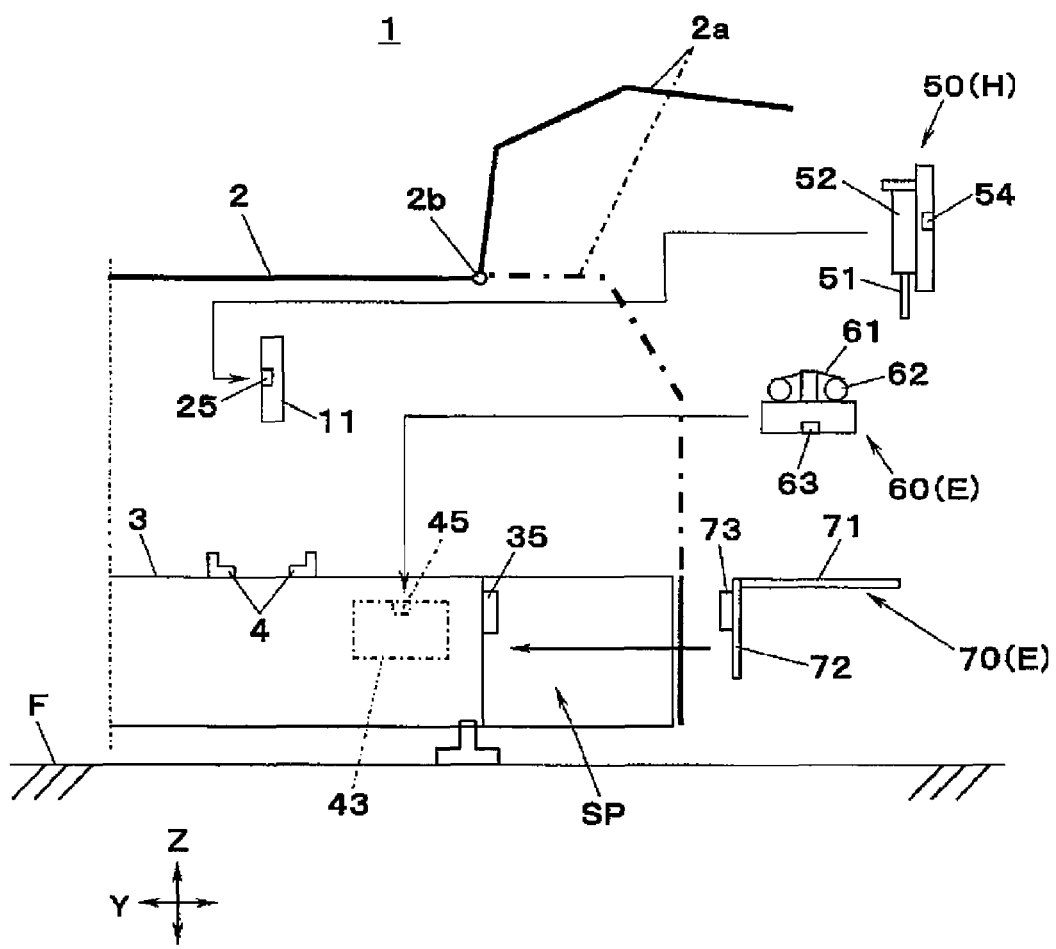
FIG. 6 A partial enlarged side view of the parts mounting related work device according to the embodiment of the invention.
Figure 7:
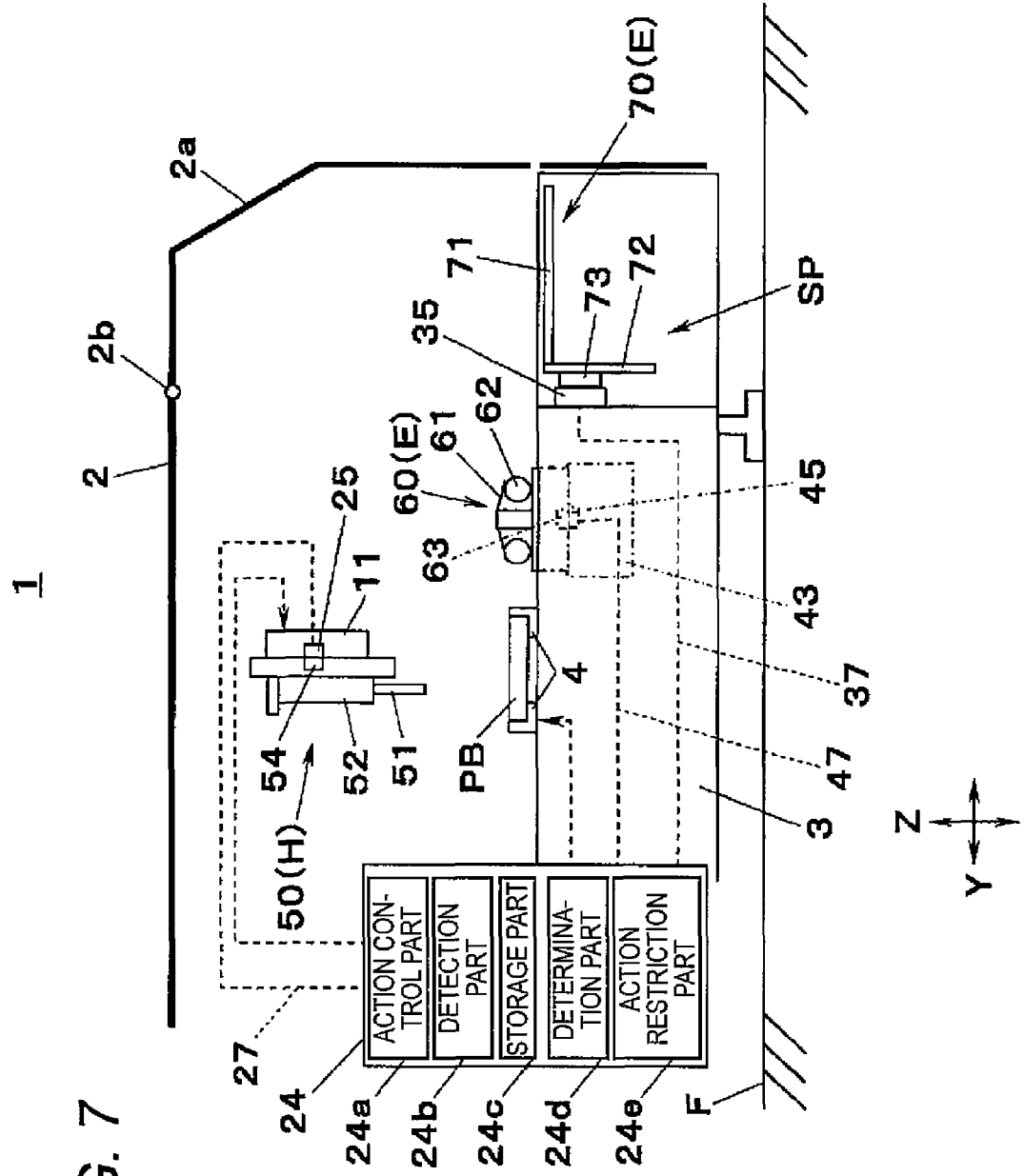
FIG. 7 A partial enlarged side view of the parts mounting related work device according to the embodiment of the invention.

When application work is performed by the parts mounting related work device 1, in addition to replacing the mounting head 12 on the moving stage 11 by the application head 50, the nozzle changer 40 in the base portion 43 is replaced by a trial application unit 60 (FIGS. 5, 6 and 7). Then, after trolley 30 is removed from the trolley insertion space SP to remove the part supply units 15 from the base platform 3, a safety cover 70, which covers at least part of a portion which communicates with an interior of the base platform 3 from the trolley insertion space SP, is placed on the base platform 3. The reason that the safety cover 70 is placed on the base platform 3 when the trolley 30 is not used is that the occurrence of a fear needs to be prevented that the operator erroneously puts his or her hand into the interior of the base platform 3 from the trolley insertion space SP since the trolley insertion space SP is left open to the outside after the trolley is removed from the trolley insertion space SP.

In FIGS. 6 and 7, the application head 50 as a working head H includes a syringe 51 provided so as to extend downwards and an adhesive accommodating portion 52 for supplying an adhesive to the syringe 51. When a syringe driving mechanism 53 (FIG. 8) is driven from the action control part 24a of the control unit 24, the syringe 51 is made to discharge the adhesive downwards which is supplied from the adhesive accommodating portion 52.

In FIGS. 6 and 7, the trial application unit 60 is such as to perform a trial application to inspect whether or not a proper amount of adhesive is discharged from the syringe 51 before actual application work is done on the board PB by the application head 50 and includes a sheet member 61 to which a trial application of adhesive is made and a sheet take-up mechanism 62 for taking up the sheet member 61 so that a fresh application surface of the sheet member 61 is oriented upwards at all times.

In FIGS. 6 and 7, the safety cover 70 includes a horizontal portion 71 which covers a portion which communicates with an interior of the base platform cover 2 from the trolley insertion space SP so as to put a lid on the portion from therebelow and a vertical portion 72 which is provided to extend downwards from the horizontal portion 71 to cover the portion which communicates with the interior of the base platform 3 from the trolley insertion space SP (here, for example, about a portion below the base platform side connector 35) so as to put a lid on the portion from a side of the base platform 3, with the safety cover 70 placed on the base platform 3.

Since the coupling of the moving stage side connector 25 and the mounting side connector 26 is disconnected when the mounting head 12 is removed from the moving stage 11, the control unit 24 recognizes that the mounting head 12 is detached from the moving stage 11. In addition, since the coupling of the base platform side connector 45 and the nozzle changer side connector 46 is disconnected when the nozzle changer 40 is removed from the base portion 43, the control unit 24 recognizes that the nozzle changer 40 is detached from the moving stage 11. As is shown in FIGS. 5 and 6, in the base platform cover 2, a door portion 2a at an end portion in the Y-axis direction can be opened upwards or closed downwards about a hinge 2b as a pivot, the operator can take out the detached mounting head 12 and the removed nozzle changer 40 to the outside of the base platform cover 2 with the door portion 2a kept opened upwards (an arrow B shown in FIG. 5).

Since the coupling of the base platform side connector 35 and the trolley side connector 36 is disconnected when the trolley 30 attached to the base platform 3 is detached from the base platform 3 (FIG. 5), the control unit 24 recognizes that the trolley 30 is detached from the base platform 3.

When the application head 50 is attached to the moving stage 11 (FIGS. 6 and 7), the moving stage side connector 25 provided in the moving stage 11 and an application head side connector 54 provided in the application head 50 are coupled together (also refer to FIG. 8), and signal cables and power cables for activating a syringe driving mechanism 53 provided in the application head 50 are connected together. The control unit 24 detects that the moving stage side connector 25 and the application head side connector 54 are coupled together by the plug-and-play function via the first connector wiring 27 and grasps the stage in which the application head 50 is attached to the moving stage 11.

When the trial application unit 60 is mounted in the base portion 43 (FIGS. 6 and 7), the base portion side connector 45 provided in the base portion 43 and a trial application unit side connector 63 provided in the trial application unit 60 are coupled together (also refer to FIG. 8), and signal cables and power cables for activating a trial application sheet take-up mechanism 62 are connected together. The control unit 24 detects that the base portion side connector 45 and the trial application side connector 63 are coupled together by the plug-and-play function via the third connector wiring 47 and grasps the state in which the trial application unit 60 is mounted in the base portion 43.

In FIGS. 6 and 7, when the safety cover 70 is placed on the base platform 3, the base platform side connector 35 and a safety cover side connector 73 provided on the vertical portion 72 of the safety cover 70 are coupled together (also refer to FIG. 8). The control unit 24 detects that the base platform side connector 35 and the safety cover side connector 73 are coupled together by the plug-and-play function via the second connector wiring 37 and grasps the state in which the safety cover 70 is placed on the base platform 3.

Here, the base platform side connector 35 and the safety cover side connector 73 may only have to be configured to be coupled together only in such a state that the safety cover 70 is placed on the base plat form 3. Both the connectors 35, 73 may come to be coupled together by an action to place the safety cover 70 on the base platform 3, or one or both of the connectors 35, 73 may be connector to cords so that both the connectors 35, 73 come to be coupled together manually, separately from the attachment after the safety cover 70 is placed on the base platform 3.

In the application work by the parts mounting related work device 1, firstly, the action control part 24a of the control unit 24 activates the board transfer path 4, transfers a board PB which has been transferred from the upstream unit into the interior of the parts mounting related work device 1 from the board entrance 5 and positions the board PB in a predetermined position. Then, the board camera 16 is caused to capture an image of a board mark so as to obtain a positional deviation of the board PB from a reference position thereof.

Having obtained the positional deviation of the board PB, the action control part 24a of the control unit 24 moves the moving stage 11 to a position lying above the board PB, causes the syringe 51 to discharge downwards the adhesive supplied from the adhesive accommodating portion 52 and applies the adhesive to a target application position on the board PB. When applying the adhesive on to the board PB, the action control part 24a of the control unit 24 performs a correcting action of the relative position of the syringe 51 to the board PB so that the positional deviation of the board PB from the reference position thereof which was obtained when the board PB was positioned is corrected.

When the application work of the adhesive on to the board PB is ended, the action control part 24a of the control unit 24 drives the board transfer path 4 so as to discharge the board PB to the outside of the parts mounting-related work from the board exit 6.

In the parts mounting related work device 1 according to the embodiment, by changing the working head H of the moving stage 11 from the mounting head 12 to an inspection head 80, the parts mounting related work device 1 can be used as an inspection device so as to perform inspection work on a surface of a board PB.

When the inspection work of a surface of a board PB is performed by the parts mounting related work device 1, in addition to changing the mounting head 12 attached to the moving stage 11 to the inspection head 80, the nozzle changer 40 in the base portion 43 is replaced by a calibrator 90(FIGS. 5, 9 and 10), the trolley 30 is removed from the trolley insertion space SP to remove the part supply units 15 from the base platform 3, and an inspection unit (for example, a personal computer) 100 is inserted into the trolley insertion space SP so as to be mounted in the base platform 3 based on a predetermined procedure after the safety cover 70 is placed on the base platform 3 (FIGS. 5, 9 and 10). Here, the reason that the safety cover 70 is placed on the base platform 3 even though the inspection unit 100 is mounted in the lower portion (in the trolley insertion space SP) of the base platform 3 is that there occurs a case where the inspection unit 100 is removed from the trolley insertion space SP so as to be moved during inspection work of a surface of a board PB and the occurrence of a fear needs to be prevented that the operator erroneously puts his or her hand into the interior of the base platform 3 from the trolley insertion space SP since the trolley insertion space SP is left open to the outside without the safety cover 70 after the inspection unit 100 is removed from the trolley insertion space SP.

In FIGS. 9 and 10, the inspection head 80 as a working head H includes an inspection camera 81 whose image capturing plane is oriented downwards, and an image capturing control is made by the action control part 24a of the control unit 24.

In FIGS. 9 and 10, the calibrator 90 includes an index mark (not shown) on an upper surface thereof which is visualized by the inspection camera 81 of the inspection head 80.

In FIGS. 9 and 10, as has been described before, with the safety cover 70 placed on the base platform 3, the safety cover 70 has the horizontal portion 71 which covers the portion which communicates with the interior of the base platform cover 2 from the trolley insertion space SP so as to put the lid on the portion from therebelow and the vertical portion 72 which is provided to extend downwards from the horizontal portion 71 to cover the portion which communicates with the interior of the base platform 3 from the trolley insertion space SP so as to put the lid on the portion from the side of the base platform 3. In addition, the inspection unit 100 has a plurality of wheels 103 on a lower surface of a housing portion 102 which incorporates an inspection unit main body 101 and a handle 104 which the operator operates to push or pull is provided on the housing portion 102. The operator operates the handle 104 to push or pull so as to move the housing portion 102 on the floor F to make the housing portion 102 approach the base platform 3 and inserts the housing portion 102 into a trolley insertion space SP for attachment of the housing portion 102 to the base platform 3 based on a predetermined procedure.

When the inspection head 80 is attached to the moving stage 11 (FIGS. 9 and 10) after the mounting head 12 has been detached from the moving stage 11 (FIG. 5), the moving stage side connector 25 provided in the moving stage 11 and an inspection head side connector 82 provided in the inspection head 80 are coupled together (also refer to FIG. 11), and signal cables and power cables for activating the inspection camera 81 provided on the inspection head 80 are connected together. The control unit 24 detects that the moving stage side connector 25 and the inspection head side connector 82 are coupled together by the plug-and-play function via the first connector wiring 27 and grasps the state in which the inspection head 80 is attached to the moving stage 11.

When the calibrator 90 is mounted in the base portion 43 (FIGS. 9 and 10) after the nozzle changer 43 has been removed from the base portion 43 (FIG. 5), the base portion side connector 45 provided in the base portion 43 and a calibrator side connector 91 provided in the calibrator 90 are coupled together (also refer to FIG. 11). The control unit 24 detects that base portion side connector 45 and the calibrator side connector 91 are coupled together by the plug-and-play function via the third connector wiring 47 and grasps the state in which the calibrator 90 is mounted in the base portion 43.

When the safety cover 70 is placed on the base platform 3 (FIGS. 9 and 10) after the trolley 30 has been detached from the base platform 3 (FIG. 5), the base platform side connector 35 and the safety cover side connector 73 are coupled together. Thereafter, when the inspection unit 100 is inserted into the trolley insertion space SP to thereby be attached to the base platform 3 based on a predetermined procedure, an inspection unit side connector 105 provided in the housing portion 102 of the inspection unit 100 is coupled to a relay connector 74 provided in the safety cover 70, and the base platform side connector 35 and the inspection unit side connector 105 are coupled together via the relay connector 74 (also refer to FIG. 11). Since the relay connector 74 in the safety cover 70 is not necessary when the application work is performed, although the relay connector 74 described above does not have to be provided in the safety cover 70 which is used in the application work, in case the relay connector 74 is provided, the safety cover 70 can desirably be shared by the inspection device and the application device.

The control unit 24 detects that the base platform side connector 35 and the safety cover side connector 73 are coupled together and that the base platform side connector 35 and the inspection unit side connector 105 are coupled together through the coupling of the relay connector 74 and the inspection unit side connector 105 by the plug-and-play function via the second connector wiring 37 and grasps the state in which the safety cover 70 is placed on the base platform 3 and the inspection unit 100 is mounted in the base platform 3 via the safety cover 70.

In the parts mounting related work device 1, firstly, the action control part 24a of the control unit 24 moves the moving stage 11 in the horizontal plane to be positioned above the calibrator 90 and causes the inspection camera 81 provided in the inspection head 80 to capture an image of an index mark provided on an upper surface of the calibrator 90 so as to calibrate the position of a visual field or pixel dimensions of the inspection camera 81.

Having calibrated the position of the visual field of the inspection camera 81, the action control part 24a of the control unit 24 activates the board transfer path 4 to transfer a board PB transferred from the upstream unit into the parts mounting related work device 1 from the board entrance 5 and positions the board PB in a predetermined working position. Then, the moving stage 11 is caused to move within the horizontal plane so as to be positioned above the board PB, and the board camera 16 is caused to take an image of a board mark so as to obtain a positional deviation of the board PB from a reference position thereof.

Having obtained the positional deviation of the board PB, the action control part 24a of the control unit 24 moves the moving stage 11 to a position lying above the board PB to inspect a surface of the board PB by the inspection camera 81. When performing the inspection work of the surface of the board PB, the action control part 24a of the control unit 24 performs a correcting action of the relative position of the inspection camera 81 to the board PB so as to correct the positional deviation of the board PB from the reference position thereof.

When the inspection work of the surface of the board PB is ended, the action control part 24a of the control unit 24 drives the board transfer path 4 so as to discharge the board PB to the outside of the parts mounting related work device 1 from the board exit 6.

Here, a detecting portion 24b (refer to FIGS. 3, 8 and 11) provided in the control unit 24 is designed not only to detect the type of the working head H attached to the moving stage 11 through the first connector wiring 27 and but also to detect the type of the working equipment E mounted in the base platform 3 (the lower portion and the base portion 43 of the base platform 3) before the parts mounting work, the adhesive application work or the inspection work of the surface of the board PB is started.

Namely, in the embodiment, the first connector wiring 27 and the detecting portion 24b of the control unit 24 constitute a head type detecting means for detecting the state in which the working head H is attached to the moving stage 11 and the type of the working head H attached to the moving state 11 by detecting that the connector (the moving stage side connector 25) on the side of the moving stage 11 and the connector (the mounting head side connector 26, the application head side connector 54 or the inspection side connector 82) on the side of the working head H (the mounting head 12, the application head 50 or the inspection head 80) are coupled together.

In the embodiment, the second connector wiring 37 and the third connector wiring 47 and the detecting portion 24b of the control unit 24 constitute an equipment type detecting means for detecting the state in which the working equipment E is mounted in the base platform 3 and the type of the working equipment E by detecting that the connector (the base platform side connector 35) on the side of the base platform 3 and the connector (the base platform side connector 36, the safety cover side connector 73 or the safety cover side connector 73 and the inspection unit side connector 105) on the side of the working equipment E (the trolley 30, the safety cover 70 or the safety cover 70 and the inspection unit 100) are coupled together and detecting the state in which the working equipment E is mounted in the base portion 43 and the type of the working equipment E mounted in the base platform 3 by detecting that the connector (the base portion side connector 45) on the side of the base portion 43 and the connector (the nozzle changer side connector 46, the trial application side connector 63 or the calibrator side connector 91) on the side of the working equipment E (the nozzle changer 40, the trial application unit 60 or the calibrator 90) mounted in the base portion 43 are coupled together.

In FIG. 8, combinations of the types of the working heads H and the types of the working equipment E which correspond to the contents of the work that can be done on a board PB are stored in a storage part 24c of the control unit. Specifically, as is shown in FIG. 12, stored in the storage part 24c are a combination of the mounting head 12 and the trolley 30 and the nozzle changer 40 which constitute the working equipment E corresponding to the mounting head 12, a combination of the application head 50 and the safety cover 70 and the trial application unit 60 which constitute the working equipment E corresponding to the application head 50 and further, a combination of the inspection head 80 and the safety cover 70, the inspection unit 100 and the calibrator 90 which constitute the working equipment E corresponding to the inspection head 80.

A determination part 24d of the control unit 24 determines whether or not the combination of the type of the working head H which is detected by the head type detector (the first connector wiring 27 and the detection part 24b) and the type of the working equipment which is detected by the equipment detector (the second connector wiring 37, the third connector wiring 47 and the detection part 24b) coincides with any of the combinations stored in the storage part 24c. An action restriction part 24e of the control unit 24 is designed to restrict the moving action of the moving stage 11 by the action control unit 24a in case the determination part 24d determines that the combination of the type of the working head H which is detected by the head type detector and the type of the working equipment which is detected by the equipment detector coincides with none of the combinations stored in the storage part 24c.

Namely, the parts mounting related work device 1 according to the embodiment includes the working heads H which are detachably attached to the moving stages 11 and which are changed in accordance with the contents of the work that is performed on the boards PB, the action control means (the action control part 24a of the control unit 24), the working equipment E which is removably mounted in the base platform 3 and which is changed in accordance with the contents of the work that is performed on the boards PB, the storage part 24c (the storage) storing the combinations of the types of the working heads H and the types of the working equipment E which correspond to the contents of the work that is performed on the board PB, the head type detector (the first connector wiring 27 and the detection part 24b of the control unit 24) for detecting the type of the working head H attached to the moving stage 11, the equipment type detector (the second connector wiring 37, the third connector wiring 47 and the detection part 24b of the control unit 24) for detecting the type of the working equipment E mounted in the base platform, the determination part 24d (the determination unit) for determining whether or not the combination of the type of the working head H which is detected by the head type detector and the type of the working equipment E which is detected by the equipment type detector coincides with any of the combinations stored in the storage part 24c and the action restriction part 24e (the action restriction means) for restricting the moving action of the moving stage 11 by the action control unit 24a (the action control means) in case the combination of the type of the working head H which is detected by the head type detector and the type of the working equipment E which is detected by the equipment type detector coincides with none of the combinations stored in the storage part 24c.

In this way, in the parts mounting related work device according to the embodiment, although the plurality of types of work can be performed on the boards PB by changing the working heads H attached to the moving stages 11 and changing the working equipment E mounted in the base platform 3, in case the combination of the type of the working head H which is detected by the head type detector (that is, attached to the moving stages) and the type of the working equipment E which is detected by the equipment type detector (that is, mounted in the base platform 3) coincides with none of the combinations stored in the storage part 24c, the moving actions of the moving stages 11 are designed to be restricted. Because of this, as the condition for operation of the parts mounting related work device 1, the correct combination of working head H and working equipment E needs to be used. Thus, since there is no such situation that no work is done with a wrong combination of working head H and working equipment E, it is possible to prevent the occurrence of an unexpected operation failure and an erroneous stopping of the whole system which are attributed to an error in combination of working head and working equipment.

While the embodiment of the invention has been described heretofore, the invention is not limited to the embodiment. For example, the safety cover 70 may only have to cover at least part of the portion which communicates with the interior of the base platform 3 from the trolley insertion space SP, and the configuration of the safety cover 70 and the way in which the safety cover 70 is mounted in the base platform 3 are not limited to those described in the embodiment.

In the embodiment, while the head type detector is such as to detect the state in which the working head H is attached to the moving stage 11 and the type of the working head H attached by detecting that the connector on the side of the moving stage 11 and the connector on the side of the working head H are coupled together, the method of detecting the state in which the working head H is attached to the moving stage 11 and the type of the working head attached by the head type detector is not limited to the coupling of the connectors which is disclosed in the embodiment, and hence, other methods (for example, a method of detecting that part of the working head H attached to the moving stage 11 is in a specific position to the working head H by a non-contact type sensor or the like) may be adopted.

Similarly, while the equipment type detector is such as not only to detect the state in which the working equipment E is mounted in the base platform 3 and the type of the working equipment E mounted by detecting that the connector on the side of the base platform 3 and the connector n the side of the working equipment E are coupled together but also to detect the state in which the working equipment E is mounted in the base portion 43 and the type of the working equipment E mounted by detecting that the connector on the side of the base portion 43 and the connector on the side of the working equipment E mounted in the base portion 43 are coupled together, the method of detecting the state in which the working equipment E is mounted in the base platform 3 or the base portion 43 by the equipment type detector is not limited to the coupling of the connectors disclosed in the embodiment, and hence, other methods may be adopted which utilize the non-contact type sensor.

In the embodiment, the parts mounting related work device 1 is a working device which performs work related to parts mounting in which parts P are mounted on a board PB. Consequently, the contents of work that the parts mounting related work device of the invention include screen printing work which is performed by a printing head which is attached to the moving stage 11 in addition to the parts mounting work performed by the mounting head 12 attached to the moving stage 11, the adhesive application work performed by the application head 50 attached to the moving stage and the inspection of the surface of the board PB which is performed by the inspection camera 80 attached to the moving stage 11.

While the invention has been described in detail and by reference to the specific embodiment, it is obvious to those skilled in the art to which the invention pertains that various alterations or modifications can be made without departing from the spirit and scope of the invention.

The present patent application is based on Japanese Patent Application (No. 2008-172039) which was filed in Jul. 1, 2008, the contents of which are incorporated herein by reference.

INDUSTRIAL APPLICABILITY

The parts mounting related work device is provided which can prevent the occurrence of an unexpected operation failure and an erroneous stopping of the whole system which are attributed to an error in combination of working head and working equipment.

DESCRIPTION OF REFERENCE NUMERALS AND CHARACTERS

1 parts mounting related work device; 3 base platform; 4 board transfer path (board positioning portion); 11 moving stage; 12 mounting head (working head); 24a action control part (action control means); 24b detection part (head type detector, equipment type detector); 24c storage part (storage); 24d determination part (determination part); 24e action restriction part (action restriction means); 27 first connector wiring (head type detector); 30 trolley (working equipment); 37 second connector wiring (equipment type detector); 40 nozzle changer (working equipment); 47 third connector wiring (equipment type detector); PB board

The invention claimed is:

1. A parts mounting related work device comprising
    a base platform comprising a board positioning portion which positions a board and provided with a base platform side connector,
    a moving stage provided movably relative to the board which is positioned by the board positioning portion,
    a working head detachably attached to the moving stage for change in accordance with contents of work to be done on the board,
    an action controller for performing a moving action control of the moving stage,
    working equipment removably mounted on the base platform for change in accordance with contents of work to be done on the board and provided with a working equipment side connector,
    a storage which stores combinations of types of working heads and types of working equipment which correspond to contents of work to be done on the board,
    a head type detector for detecting a type of a working head currently attached to the moving stage,
    an equipment type detector for detecting a type of working equipment currently mounted on the base platform by coupling the base platform side connector and the working equipment side connector,
    a determination unit for determining whether or not a combination of the type of the working head currently detected by the working head type detector and the type of the working equipment currently detected by the working equipment type detector coincides with any of the combinations stored in the storage, and
    action restriction means for restricting a moving action of the moving stage in case the determination unit determines that the combination of the type of the working head currently detected by the working head type detector and the type of the working equipment currently detected by the working equipment type detector coincides with none of the combinations stored in the storage,
    wherein the working equipment includes both of working equipment to be attached to a lower portion of the base platform and working equipment to be attached to a base portion incorporated in the base platform.

2. A parts mounting related work device as set forth in claim 1,
    wherein when an open state which enables the operator to access a working space is produced depending upon a combination of working head and working equipment, a safety cover is included as a part of the working equipment which is used in combination with the selected working head.

* * * * *